United States Patent [19]

Klein

[11] Patent Number: 4,574,877
[45] Date of Patent: Mar. 11, 1986

[54] CAN-TYPE EVAPORATIVE COOLING DEVICE FOR POWER SEMICONDUCTOR ELEMENTS

[75] Inventor: Erwin Klein, Heddesheim, Fed. Rep. of Germany

[73] Assignee: Brown, Boveri & Cie AG, Mannhein, Fed. Rep. of Germany

[21] Appl. No.: 585,982

[22] Filed: Mar. 5, 1984

[30] Foreign Application Priority Data

Mar. 3, 1983 [DE] Fed. Rep. of Germany ....... 3307703

[51] Int. Cl.⁴ ............................................ H01L 23/46
[52] U.S. Cl. ........................... 165/104.33; 165/104.21; 357/82; 361/385
[58] Field of Search ...................... 165/104.21, 104.33; 357/82; 361/385

[56] References Cited

U.S. PATENT DOCUMENTS 3,989,099 11/1976 Hosono et al. ...................... 361/385

FOREIGN PATENT DOCUMENTS 140651 11/1981 Japan ...................................... 357/82

Primary Examiner—Albert W. Davis, Jr.
Attorney, Agent, or Firm—Herbert L. Lerner; Laurence A. Greenberg

[57] ABSTRACT

Figure 1:
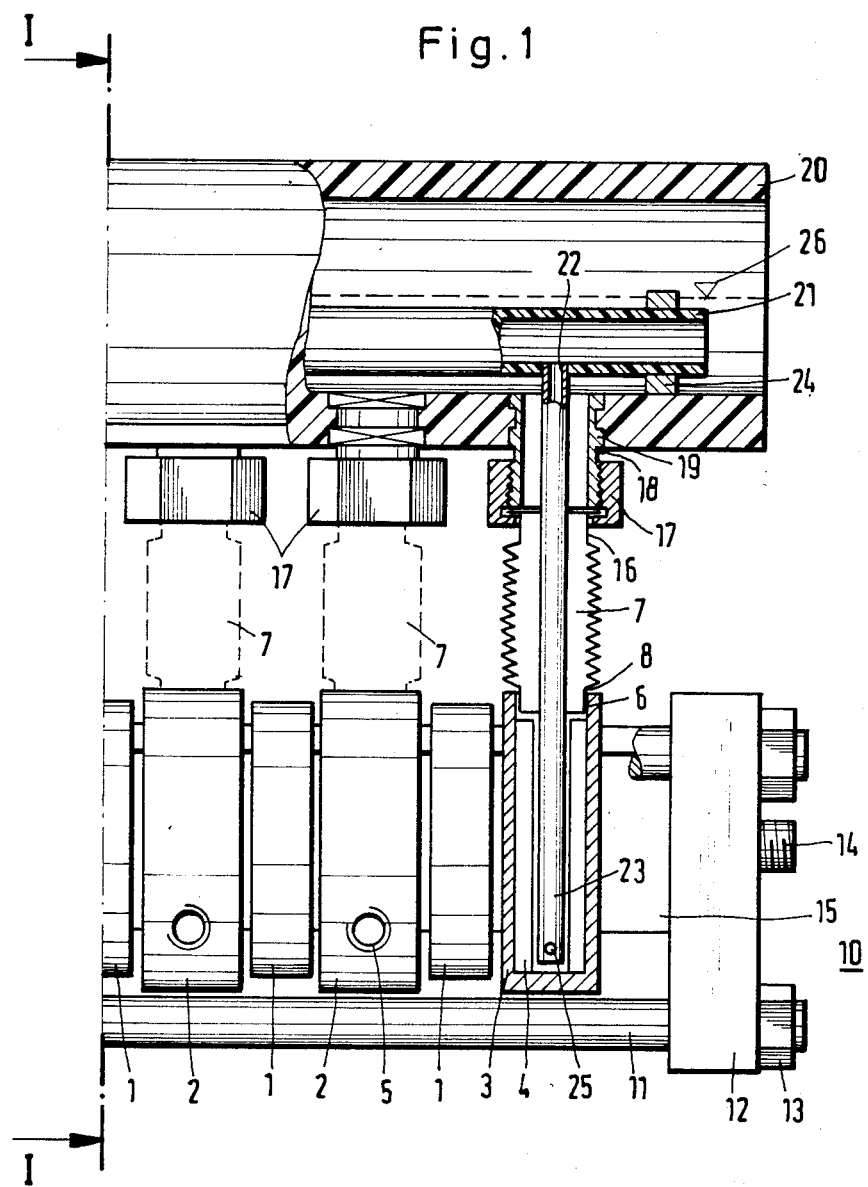

In the disclosed can-type evaporative cooling device for power semiconductor elements, the semiconductor elements (1) are stacked, in disk cell construction, alternately with cooling cans (2) to form a column having a conjoint clamping device (10). The cooling cans (2) have evaporator cavities for receiving an electrically insulating cooling liquid which evaporates when the semiconductor elements (1) are in operation. A closed coolant circuit between the cooling cans (2) and a conjoint recooler, via pipelines, results. For electrical separation of the electrically live cooling cans (2) from one another and from the recooler, electrically insulating horizontal vapor collecting lines (20) and condensate collecting lines (21) are provided to each of which are connected vertical vapor lines (7) and condensate lines (23), respectively, for the individual cooling cans (2). The condensate lines (21, 23) are each accommodated in the corresponding vapor lines (7, 20). Preferably, a cast polyamide is used as the material for the vapor collecting lines (20). Significant figure: FIG. 1

2 Claims, 2 Drawing Figures

CAN-TYPE EVAPORATIVE COOLING DEVICE FOR POWER SEMICONDUCTOR ELEMENTS

The present invention relates to a can-type evaporative cooling device for power semiconductor elements according to the preamble of claim 1.

A can-type evaporative cooling device of this nature, for power semiconductor elements, is disclosed in German Offenlegungsschrift No. 2,414,270. There chains of semiconductor elements connected in series are formed, with a conjoint cooling circuit for removing the dissipated energy of the semiconductor elements. Each semiconductor element is in thermal contact with two cooling cans so that when employing n semiconductor elements n+1 cooling cans are needed. For making contact with a column consisting of a plurality of individual semiconductor elements, only one conjoint clamping device is needed.

Since the individual semiconductor elements are at different electrical potentials, there is a need for electrically insulating the semiconductor elements both from one another and from the recooler, but to connect them hydraulically. This entails electrical insulating zones between the cooling cans and the recooler. Since can-type evaporative cooling employs vapor lines and condensate lines, the use of n semiconductor elements demands 2(n+1) insulating zones.

In column-type construction, constructional tolerances in the direction of the column axis and length tolerances of the individual hydraulic connections must be taken into account. Accordingly, the hydraulic lines must be capable of cardanic and longitudinal movement.

The pressures and temperatures involved during boiling, in conjunction with the generally non-inert behavior of the boiling liquids and their vapors, have the effect that when using electrically insulating hoses materials must be employed which meet the mobility requirements only if employed in large lengths. This is however not always feasible. Since moreover the technique of making connections—gas-tightness is demanded—presents problems with hoses, a different construction can be chosen as an alternative. This construction is characterized by so-called metallic corrugated pipes, with interposition of insulating pipes. To ensure gas-tightness, soldering is advantageously employed to join such components. This demands electrical insulation capable of being soldered, such as is for example generally known in the form of aluminum oxide pipes.

Such soldered joints present problems in respect of absence of leaks. Moreover, the processing operation is also very expensive. In addition the length of the insulating pipes can greatly affect the overall height, especially in the case of equipment which is to be of compact construction.

Starting from this situation, it is the object of the invention to provide a can-type evaporative cooling device for power semiconductor elements, of the nature mentioned at the outset, which device provides an effective hydraulic connection, which is however electrically insulating, between the individual semiconductor elements which are at different potentials and also between the elements and the recooler and which at the same time compensates for the thermal expansions of the individual components during operation.

This object is achieved by the features characterized in claim 1.

The advantages achievable by the invention are in particular that by interlacing of vapor lines and condensate lines a substantial simplification of the construction of the cooling device is achieved. Since the horizontal vapor collecting lines and condensate collecting lines alone ensure electrical insulation, the vertical lines only serve to allow for tolerances. This has the advantage that earthing problems can be simplified and it is easy to adopt protective insulation.

Advantageous embodiments of the invention are characterized in the sub-claims.

The invention is explained below with reference to the embodiment shown in the drawings.

Figure 2:
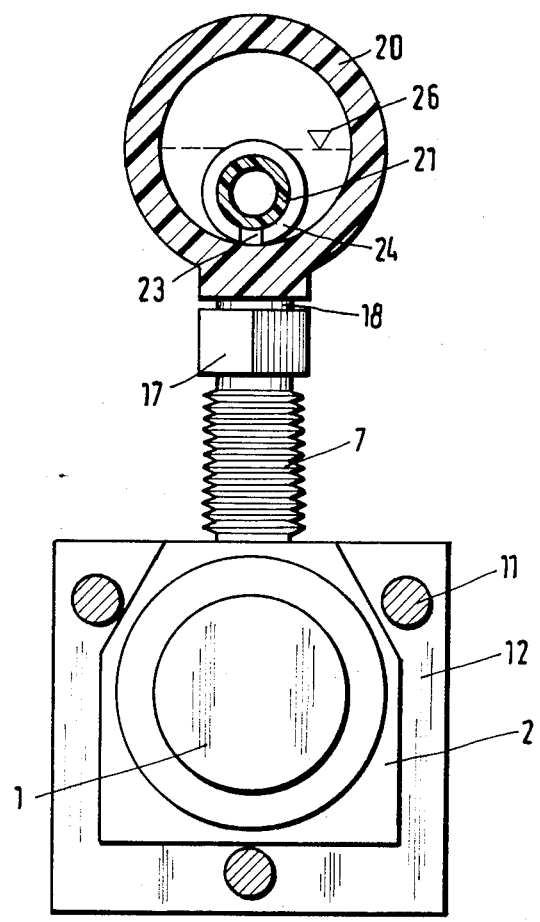

In the drawings:

FIG. 1 shows a plan view of a part of a semiconductor column with can-type evaporative cooling device and FIG. 2 shows a section through a side view of this column.

FIG. 1 shows a plan view of a part of a semiconductor column with can-type evaporative cooling device. A plurality of power semiconductor elements 1 are stacked alternately with metallic cooling cans 2, which consist of a material having good electrical and thermal conductivity, to form a column. In the present context, semiconductor elements 1 are to be understood as power diodes or power thyristors in metal-ceramic housings. The column thus produced has n semiconductor elements 1 and n+1 cooling cans 2.

The cooling cans 2 can for example consist each of two identical half-shells, in whose internal cavities fins 4 extend from the bottoms 3 of the cooling cans in order to increase the boiling surfaces. The half-shells of the cooling cans 2 are then integrally joined together. For electrical connection, the cooling cans 2 are provided with at least one threaded hole 5.

In a bore 6 for hydraulic connection, located in the upper part of the cooling cans 2, a vertical vapor line 7 (gas line), preferably a metallic corrugated pipe, is soldered-in by one of its ends 8.

The column consisting of semiconductor elements 1 and cooling cans 2 is frictionally contacted by means of a contact device 10 (clamping device for thermal and electrical contacting). The contact device 10 can for example consist of three tension rods 11 which connect together two yoke plates 12 (only one of the yoke plates 12 being shown), with the aid of nuts 13. In order to apply a defined contact force, cup springs, not shown in the drawing, are supported in the yoke plates 12. The reaction forces of the springs are applied to the cooling cans 2 via screws 14 and insulators 15. The insulators 15 can be omitted if the tension rods 11 are of electrically insulating construction and if the column is also fixed in an electrically insulating manner.

At its second end 16, the vertical vapor line 7 is constructed as a connection of a pipe screw coupling. The frictional joining of the pipe screw coupling connection of the vertical vapor line 7 to a nozzle 18 is effected by means of a union nut 17. The nozzle 18 is positively embedded, by means of undercut polygonal ribs 19, in a horizontal vapor collecting line 20 (gas collecting line). Upon boiling, the rising vapor is removed via this vapor collecting line 20. The line 20 can be connected to a recooler or heat exchanger, not shown in the drawing, with the stream of vapor moving towards the recooler and condensing there.

A horizontal condensate collecting line 21 (liquid collecting line) is introduced into the horizontal vapor collecting line 20 before the line is sealed. The line 21 has bores 22 into which vertical condensate lines 23 are frictionally inserted, these lines passing through the nozzle 18 of the vapor collecting line 20 and through the vertical vapor line 7. The horizontal condensate collecting line 21 is fixed in the horizontal vapor collecting line 20 by means of holder 24. One vertical condensate line 23 leads to each cooling can 2. The condensate lines 23 are preferably concentrically arranged in the vertical vapor lines 7. The condensed boiling liquid is fed through the condensate collecting lines 21 into the lower zone of the cooling can 2; preferably, the liquid issues into the cavity of the cooling cans not in an axial direction but sideways through a plurality of bores 25.

Boiling liquid can then be supplied to the condensate collecting lines 21 directly from the vapor collecting line 20 if the condensate level 26 (liquid level) is sufficiently high. Alternatively, they can be fed directly from the recooler if the condensate collecting line 21 is connected to the latter.

The total cooling device has a recooler which feeds a plurality of such condensate collecting lines 21 and is connected to a plurality of vapor collecting lines 20 for a plurality of semiconductor columns.

FIG. 2 shows a section through a side view of a semiconductor column. Specifically, it reveals a power semiconductor element 1, a cooling can 2 with a vertical vapor line 7, a union nut 17, a nozzle 18, a horizontal vapor collecting line 20, a horizontal condensate collecting line 21, a vertical condensate line 23 and a holder 24. The condensate level is marked 26. The contact device 10, consisting of three tension rods 11 and yoke plates 12, is also shown.

Since in the temperature range which is of interest the volume ratio of vapor (gas) to liquid (condensate) is very high—for example about 140, at a temperature of 60° C., for boiling liquid R 113 according to DIN 8962—the diameters of the condensate lines 21 and 23 can be kept small so that the vapor streams are not hindered by the liquid lines 21, 23 inserted into the vapor lines 7, 20.

The vertical condensate lines 23 preferably extend almost to the bottom of the cooling cans 2. Special leaktightness at the connections (bores 22) between horizontal condensate collecting lines 21 and vertical condensate lines 23 is not needed. Since the vertical condensate lines 23 can be very thin and are intended to be made of a plastic, there is sufficient mobility to compensate for tolerances. The reason why the condensate lines 21, 23 should be made of plastic is to provide a high resistance to heat flow. This prevents the incoming liquid from boiling before flushing over the interior of the cooling can. Preferred plastic pipes for the condensate lines 21, 23 are extruded polyamide pipes.

The insulating material employed for the horizontal vapor collecting line 21 is preferably a highly heat-resistant, mechanically stable thermoplastic which is also resistant to the boiling liquid. At the same time it is to be borne in mind that the mounting of the nozzles 18 in the horizontal vapor collecting line 21 by means of polygonal ribs 19 must be such that it not only ensures gas-tightness but also absence of twisting when the union nut of the pipe screw coupling is turned. Accordingly, a cast polyamide is a suitable material for the vapor collecting line 20. After casting, it shrinks so greatly that gas-tightness of the nozzle connections is ensured even at high temperatures. The absence of twisting is also easily ensured by appropriate design of the pipe screw coupling nozzles 18. Since the material in question also has high tracking resistance, it presents no problem to classify the can-type evaporative cooling device, described above, as "protectively insulated".

As an alternative to the cast polyamide, an extruded polyamide pipe can also be employed as the vapor collecting line 20 if, for making the vapor collecting line connections, flanges with an internal thread are provided for the nozzles, which in that case must have external threads. The flanges can then be connected to the vapor collecting lines 20 by means of "flush welds".

What is claimed is:

1. An evaporative cooling device for power semiconductor elements, comprising cooling cans alternatingly stacked with the semiconductor elements to form a column, said cooling cans having a bottom and having evaporator cavities formed therein for receiving electrically insulating cooling liquid evaporating during operation of the semiconductor elements, and a cooling circuit connected between said cooling cans and a recooler, said cooling circuit including horizontal vapor collecting lines formed of electrically insulating cast polyamide, vertical vapor lines in the form of metallic corrugated tubes connected from said cooling cans to said horizontal vapor collecting lines for conducting vapor generated in said cooling can through said horizontal vapor collecting lines to the recooler, nozzles cast into said horizontal vapor collecting lines, pipe thread coupling connections connecting said metallic corrugated tubes to said nozzles, horizontal condensate collecting lines disposed in said horizontal vapor collecting lines in the form of electrically insulating synthetic tubes having bores formed therein, and vertical condensate lines in the form of electrically insulating synthetic tubes disposed in said metallic corrugated tubes, locked in said bores formed in said horizontal condensate collecting lines and leading from said horizontal vapor collecting lines to a position just above said bottom of said cooling cans, said vertical condensate lines having lateral bores formed therein in said evaporator cavities for conducting condensate precipitated in the recooler through said horizontal condensate collecting lines to said cooling cans.

2. An evaporative cooling device as claimed in claim 1, wherein the vertical condensate lines (23) are located concentrically in the vertical vapor lines (7).

* * * * *

UNITED STATES PATENT AND TRADEMARK OFFICE
CERTIFICATE OF CORRECTION

PATENT NO. : 4,574,877
DATED : March 11, 1986
INVENTOR(S) : ERWIN KLEIN

It is certified that error appears in the above-identified patent and that said Letters Patent are hereby corrected as shown below:

On the title page

In the heading, item (30), line 13,

"Mar. 3, 1983 (DE) Fed. Rep. of Germany .....3307703"

should read

--Mar. 4, 1983 (DE) Fed. Rep. of Germany .....3307703--.

Signed and Sealed this

Third Day of March, 1987

Attest:

DONALD J. QUIGG

Attesting Officer

Commissioner of Patents and Trademarks